350-432 SR
XR 3,169,247
TX4074C
CROSS REFERENCE
SEARCH ROOM

Feb. 9, 1965 J. K. DAVIS ETAL 3,169,247

OPHTHALMIC ASPHERIC LENS SERIES

Filed Dec. 9, 1959 6 Sheets-Sheet 1

X2034

INVENTORS
JOHN K. DAVIS
HENRY G. FERNALD
BY Louis K. Gagnon
Noble S. Williams
ATTORNEYS

3169247
OR IN 351/167

INVENTORS
JOHN K. DAVIS
HENRY G. FERNALD
BY Louis L. Gagnon
Noble S. Williams
ATTORNEYS Feb. 9, 1965 J. K. DAVIS ETAL 3,169,247

OPHTHALMIC ASPHERIC LENS SERIES

Filed Dec. 9, 1959 6 Sheets-Sheet 3

INVENTORS
JOHN K. DAVIS
HENRY G. FERNALD
BY Louis L. Gagnon
Noble S. Williams
ATTORNEYS

OPHTHALMIC ASPHERIC LENS SERIES

Filed Dec. 9, 1959 6 Sheets-Sheet 4

INVENTORS
JOHN K. DAVIS
HENRY G. FERNALD
BY Louis L. Gagnon
Noble S. Williams
ATTORNEYS

WORK CHART A

| t | SPHERE | CYL. | 0.00 / -0.25 / -0.50 | -0.75 / -1.00 / -1.25 / -1.50 | -1.75 / -2.00 / -2.25 / -2.50 / -2.75 | -3.00 / -3.25 / -3.50 / -3.75 / -4.00 | |
|---|---|---|---|---|---|---|---|
| 8.3 | +16.00 | a | 16.00 | 15.50 | 15.00 | 14.50 | a |
| 8.2 | +15.75 | b | | | | | b |
| 8.1 | +15.50 | a | 15.50 | 15.00 | 14.50 | 14.00 | a |
| 8.0 | +15.25 | b | | | | | b |
| 7.9 | +15.00 | a | 15.00 | 14.50 | 14.00 | 13.50 | a |
| 7.8 | +14.75 | b | | | | | b |
| 7.7 | +14.50 | a | 14.50 | 14.00 | 13.50 | 13.00 | a |
| 7.6 | +14.25 | b | | | | | b |
| 7.5 | +14.00 | a | 14.00 | 13.50 | 13.00 | 12.50 | a |
| 7.4 | +13.75 | b | | | | | b |
| 7.3 | +13.50 | a | 13.50 | 13.00 | 12.50 | 12.00 | a |
| 7.2 | +13.25 | b | | | | | b |
| 7.1 | +13.00 | a | 13.00 | 12.50 | 12.00 | 11.50 | a |
| 7.0 | +12.75 | b | | | | | b |
| 6.9 | +12.50 | a | 12.50 | 12.00 | 11.50 | 11.00 | a |
| 6.8 | +12.25 | b | | | | | b |
| 6.7 | +12.00 | a | 12.00 | 11.50 | 11.00 | 10.50 | a |
| 6.6 | +11.75 | b | | | | | b |
| 6.5 | +11.50 | a | 11.50 | 11.00 | 10.50 | 10.00 | a |
| 6.4 | +11.25 | b | | | | | b |
| 6.3 | +11.00 | a | 11.00 | 10.50 | 10.00 | 9.50 | a |
| 6.2 | +10.75 | b | | | | | b |
| 6.1 | +10.50 | a | 10.50 | 10.00 | 9.50 | 9.00 | a |
| 6.0 | +10.25 | b | | | | | b |
| 5.9 | +10.00 | a | 10.00 | 9.50 | 9.00 | 8.50 | a |
| 5.8 | +9.75 | b | | | | | b |
| 5.7 | +9.50 | a | 9.50 | 9.00 | 8.50 | | |
| 5.6 | +9.25 | b | | | | | |
| 5.5 | +9.00 | a | 9.00 | 8.50 | BLANK NUMBERS | | |
| 5.4 | +8.75 | b | | | | | |
| 5.3 | +8.50 | a | 8.50 | | | | |
| 5.2 | +8.25 | b | | | | | |

Fig. 5

WORK CHART B

| CURVE CODE | CYLINDER REQUIRED | SPHERE MERIDIAN | | CYLINDER MERIDIAN | |
|---|---|---|---|---|---|
| | | RADIUS IN MM | 1.4925 POWER | RADIUS IN MM | 1.4925 POWER |
| a | 0 | 140.714 | 3.500 | — | — |
| a | 0.25 | " | " | 131.333 | 3.750 |
| a | 0.50 | " | " | 123.125 | 4.000 |
| a | 0.75 | 162.488 | 3.031 | 130.257 | 3.781 |
| a | 1.00 | " | " | 122.178 | 4.031 |
| a | 1.25 | " | " | 115.043 | 4.281 |
| a | 1.50 | " | " | 108.696 | 4.531 |
| a | 1.75 | 192.383 | 2.560 | 114.269 | 4.310 |
| a | 2.00 | " | " | 108.004 | 4.560 |
| a | 2.25 | " | " | 102.391 | 4.810 |
| a | 2.50 | " | " | 97.332 | 5.060 |
| a | 2.75 | " | " | 92.750 | 5.310 |
| a | 3.00 | 236.324 | 2.084 | 96.873 | 5.084 |
| a | 3.25 | " | " | 92.332 | 5.334 |
| a | 3.50 | " | " | 88.198 | 5.584 |
| a | 3.75 | " | " | 84.419 | 5.834 |
| a | 4.00 | " | " | 80.950 | 6.084 |
| | | | | | |
| b | 0 | 132.002 | 3.731 | — | — |
| b | 0.25 | " | " | 123.713 | 3.981 |
| b | 0.50 | " | " | 116.403 | 4.231 |
| b | 0.75 | 150.842 | 3.265 | 122.665 | 4.015 |
| b | 1.00 | " | " | 115.475 | 4.265 |
| b | 1.25 | " | " | 109.081 | 4.515 |
| b | 1.50 | " | " | 103.358 | 4.765 |
| b | 1.75 | 176.271 | 2.794 | 108.385 | 4.544 |
| b | 2.00 | " | " | 102.733 | 4.794 |
| b | 2.25 | " | " | 97.641 | 5.044 |
| b | 2.50 | " | " | 93.030 | 5.294 |
| b | 2.75 | " | " | 88.835 | 5.544 |
| b | 3.00 | 212.284 | 2.320 | 92.575 | 5.320 |
| b | 3.25 | " | " | 88.420 | 5.570 |
| b | 3.50 | " | " | 84.622 | 5.820 |
| b | 3.75 | " | " | 81.137 | 6.070 |
| b | 4.00 | " | " | 77.927 | 6.320 |

Fig. 6

INVENTORS
JOHN K. DAVIS
HENRY G. FERNALD
BY Louis L. Gagnon
Noble S. Williams
ATTORNEYS INVENTORS
JOHN K. DAVIS
HENRY G. FERNALD
BY Louis L. Gagnon
Noble S. Williams
ATTORNEYS 3,169,247
OPHTHALMIC ASPHERIC LENS SERIES
John K. Davis, East Woodstock, Conn., and Henry G. Fernald, Winchester, Mass., assignors to American Optical Company, Southbridge, Mass., a voluntary association of Massachusetts
Filed Dec. 9, 1959, Ser. No. 858,468
5 Claims. (Cl. 351—167)

This invention relates to improvements in an ophthalmic lens series design. More particularly, it relates to improvements in a strongly convergent aspherically curved ophthalmic lens series design of such optical characteristics as to provide when used by aphakic patients, and the like, a relatively wide field of view for the wearer with improved visual acuity as compared with lenses of equivalent types heretofore available to the public.

The improved ophthalmic lens series of the present invention, it will be appreciated from the description which follows, comprises a plurality of lenses individually related to each other in such a manner and in such predetermined fractional dioptric steps as to conveniently and completely comprehend a substantially full range of dioptric powers (which may optionally include either spherical or cylindrical corrective prescription powers, or both, within the usual limits desired and with the cylinder axes in the case of toric lenses disposed at any prescribed angle) while maintaining said improved visual acuity at said wide angle of view and thereby caring for the requirements of most aphakic patients.

To accomplish this, each individual lens of said improved series comprises an aspherically curved refractive surface disposed upon the front face of a lens element of predetermined refractive index and a refractive surface of a given predetermined prescriptive value of usual kind disposed upon the rear face thereof and in predetermined spaced relation thereto; the front aspheric and rear prescriptive refractive surfaces, the refractive index and the axial thickness of the lens being so carefully controlled relative to each other that tangential and sagittal errors of astigmatism in outer marginal portions of the lens, even when cylindrical power at a prescribed axis is present, will be maintained within small prescribed limits, with due consideration as to lateral color, and at the same time all zonal regions of the lens nearer the center thereof will have such aberrations, if present therein, restricted to materially lesser values, whereby said improved visual acuity throughout said relatively wide field of view will be attained.

The new and improved aspheric lens series design furthermore is of such optical characteristics that a fairly large degree of freedom is provided the doctor as to fitting distance while adjusting the prescribed lenses and associated ophthalmic mounts to the face of the wearer without any material loss in visual acuity thereof throughout the field of view.

Additionally, the improved aspherically curved ophthalmic lens series design is such that not only may all of the different usual spherical and cylindrical corrections ordinarily called for by prescriptions for correcting physiological conditions of aphakic eyes be cared for by the series, which preferably extends from +7.00 to +16.00 diopters, while giving said improved acuity at said wide angles of view but, furthermore, this range may be accomplished by a single aspherically curved blank for each different dioptric power and without necessitating the use of a different aspheric surface for each different prescription to be provided within said range and notwithstanding the fact that a large variety of lenses of different prescriptive characteristics at each different power are to be cared for thereby. This is considered important from a cost standpoint since it is well-known that aspheric lens surfaces upon optical elements materially increase the cost of manufacture thereof.

Additionally, the lens design series is such that any one of the individual lenses thereof may be provided with a near vision region if desired.

It is, accordingly, a principal object of the present invention to provide a series of aspherically curved ophthalmic lenses which is of such improved optical design as to comprehend a wide range of dioptric powers while not only providing a relatively wide field of view for wearers of individual lenses thereof with good visual acuity in all parts thereof including the outer marginal portions thereof but also while affording good acuity in portions thereof nearer the center of the lenses.

It is an additional object of the invention to provide in such an improved wide field lens series design an accurate control of the tangential errors of astigmatism at the expense of the sagittal errors thereof as long as neither exceed prescribed limits; with the result that a greater degree of visual acuity in marginal regions of the lenses of the series will be obtained.

It is also an object of the invention to provide in such an ophthalmic lens series design not only said wide field of view, in the neighborhood of 30 degrees out from the center of the field, with good visual acuity but also to provide in such a series the usual spherical and cylindrical power corrections required by such patients and in the cases using cylindrical corrections allow the axis of such cylinders to be disposed at any angle desired relative the vertical and without allowing the difference between the tangential astigmatic errors at the high and low points of the toric surface (that is, at an outer point on the cylinder meridian thereof and at an outer point on the base curve meridian at right angles thereto) to exceed prescribed values; preferably the tangential error limit for spherical corrections being set at no more than +0.50 diopters and the sagittal error limit being no greater than −0.75 diopters, and for cylinder corrections the average tangential error between the high and low points values should likewise not be allowed to exceed +0.50 diopters and the sagittal error a value to −.75 diopters.

It is also an object of the invention to provide in such an improved aspherically curved ophthalmic lens series embodying both spherical and cylindrical corrections a control of the tangential and sagittal errors of astigmatism in such a manner that visual acuity in lateral marginal portions of the wide field of view may be improved at slight expense to the acuity in the upper and lower parts of the field, since it is in the former regions of the lenses that the larger angles of viewing are most frequently used by the wearer.

It is also an object of the invention to provide an improved lens series design of the character described which is such that each individual lens thereof may be disposel at various positions by the doctor within a predetermined range of fitting distances before the eyes of a patient without having the predetermined limits of tangential and sagittal error values of the lens exceed said limits.

Other objects and advantages of the invention will become apparent from the detailed description which follows when taken in conjunction with the accompanying drawings in which:

FIG. 1 is a diagrammatic sketch for use in describing the optical and physical characteristics of the several lenses of the improved aspherically curved ophthalmic lens series;

FIGS. 2 and 3 are graphs showing two different families of curves which are related to the several aspheric curvatures employed for carrying out the improved series of the invention; the curves of FIG. 2 indicating instantaneous tangential curvature values for different zonal portions on the front aspheric surfaces of the lenses of the series, and the curves of FIG. 3 indicating instantaneous sagittal curvatures for corresponding zonal portions thereof;

FIGS. 5 and 6 are work charts A and B giving working values to care for ophthalmic prescription requirements of various types;

In strongly convergent ophthalmic lenses, such as in the case of a cataract lens series, visual acuity in marginal portions of the lenses have greatly limited their useful field of view and in order to improve the acuity of such lenses as much as possible, aspheric curvatures have been employed heretofore. Nevertheless, such lenses were not entirely satisfactory since astigmatic and chromatic aberrations were present and limited and impaired the field of view of such lenses.

In the aspherically curved ophthalmic lens series of the present invention, however, it has been found that by the use of properly related front and rear refractive surfaces, with the rear surface being of a controlled spherical, cylindrical, or toric prescription value and with the front surface being a carefully controlled aspheric surface arranged to function therewith, control of astigmatism in a novel manner can be effected so as to improve image resolution, particularly in marginal portions of the field of view. Stated more exactly, these surfaces and the spacings therebetween may be so controlled that tangential errors of astigmatism are kept at a minimum while the sagittal errors of astigmatism are allowed to increase, as long as they do not increase too much.

Figures 1, 8, 10:
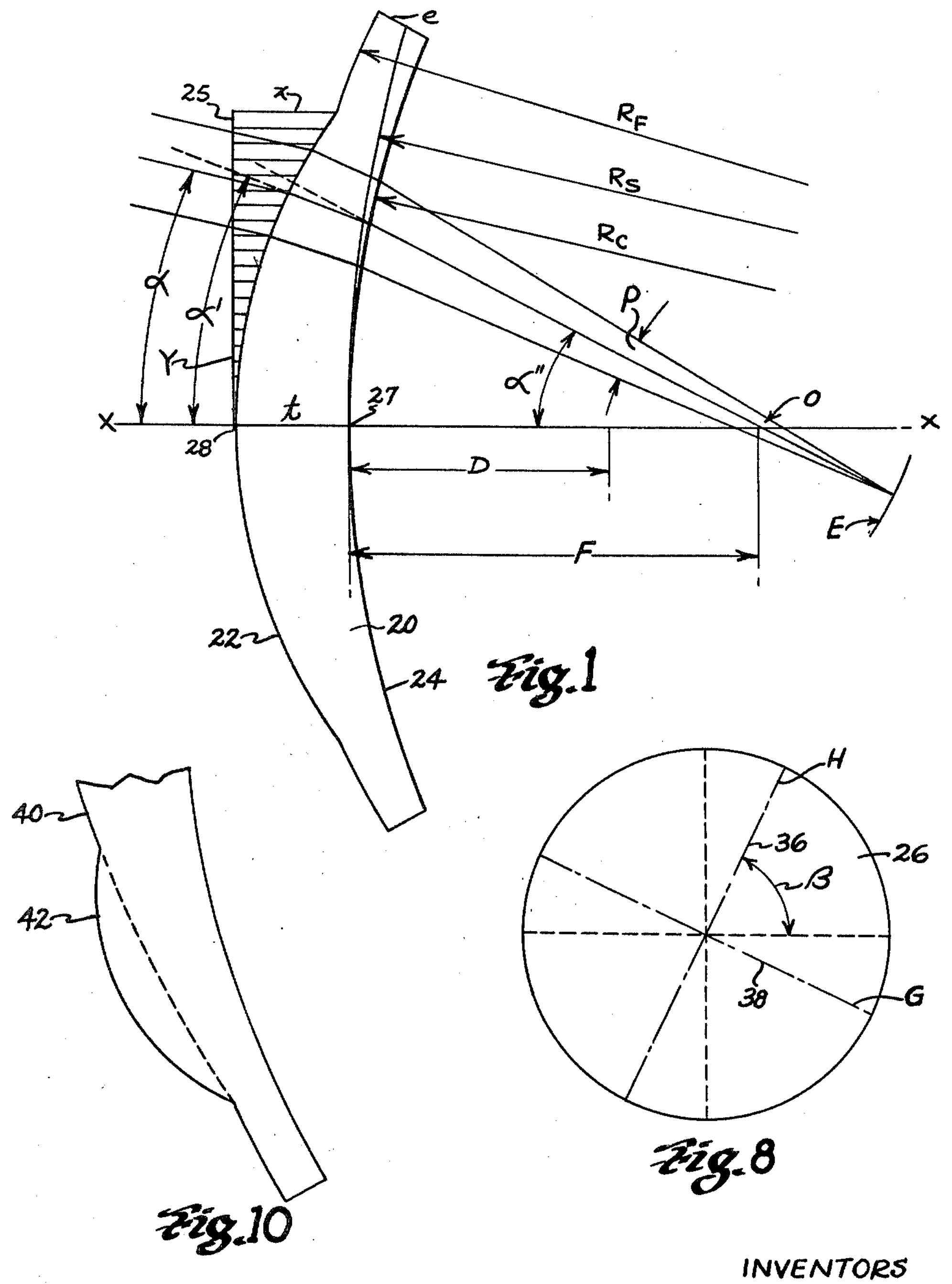
FIG. 8 is a plan view of an improved toric lens.
FIG. 10 is a side elevational view of the lower portion of an improved lens provided with a near view or reading segment.

Each individual lens of the improved wide field ophthalmic lens series of the present invention, accordingly, comprises, as indicated in FIG. 1, a lenticularly-shaped lens element 20 of predetermined refractive index having an aspherically curved refractive surface 22 formed on the front face thereof and a prescriptive refractive surface 24 on the rear or ocular surface thereof, and at a predetermined axial spacing $t$ therefrom. It will be clear from this figure that when such a lens is suitably positioned before the eye of an aphakic person, it will have the vertex of its rear surface located at a predetermined axial fitting distance F from the center of rotation O of the eye. When the eye is rotated about this center so as to allow the patient to look through an outer marginal portion of the lens, the entering light rays will approach at an angle $\alpha$, will be refracted at the front surface as indicated at $\alpha'$ and at the rear surface as indicated at $\alpha''$ before entering the eye. Of course, at this time, the pupil P will be displaced to one side of the axis X—X while the retina E, upon which the image will be focused, will be displaced at the opposite side of the axis X—X.

If good visual acuity in all parts of a field of view outwardly to and even beyond 30 degrees from the axis of the lens can be obtained, most conditions of use of such an ophthalmic lens will be cared for. (Note: Such an angular value of 38° coupled with 23.25 mm. for the fitting distance (F) for the lens, will give an aspheric surface having a diameter of approximately 40 mm.)

It has now been found that by properly aspherically curving the front surface 22 while properly relating it to a prescribed prescription curvature on the rear surface 24 thereof, an optimum correction over a relatively wide field of view, even out to 38 degrees from the axis X—X, hereinafter called the half field angle, can be obtained for all lenses of an improved series ranging from +7.00 diopters to +16.00 diopters in effective power. This improved acuity with wide angular field is only possible, however, by maintaining the tangential error of astigmatism as low as possible (and at no time more than +0.50 diopters at any place along the astigmatic aberration curve for each lens) while the sagittal error of astigmatism is allowed to increase when necessary, as long as it does not exceed a tolerable limit, which, in this instance has been set at −0.75 diopters.

A large number of tests have shown that when tangential power and chromatic aberration, which is inherently present, are combined in the image, the eye is much more sensitive thereto than it is to the saggital power errors in such a combination. This is because chromatic aberration introduces a tangential blur. Accordingly, rather than add to this blur, it is desirable to allow the saggittal error to increase somewhat while bringing the tangential error for all zones of the lens within the acceptable tolerance mentioned above; since both tangential and sagittal errors cannot both be corrected for all zonal areas of a lens of a single refractive material at the same time.

Having in mind the aberration conditions just mentioned, the freedom desired by doctors in fitting cataract lens or the like to the face of the wearer (which will be more fully discussed hereinafter) and that a useful range of dioptric powers for aphakic patients should extend at least from +7.00 to +16.00D, the ten different aspheric front surface curvatures were computed. This was done by assuming a certain base curve value for the ocular surface of the lens and a suitable central vertex power for the front aspheric side of the lens so that together with an acceptable axial thickness for the lens, a desired prescription power at the center of the lens was obtained. Thereafter, a lens blank of such values was nominally labeled by a corresponding dioptric power number, as for example, a 7 power aspheric.

Let it be assumed that a minus 3.50 diopter value is used for the base curve. Thereafter, values for the aspheric curvatures at different zonal distance from the central axis of the lens were computed. This procedure was also repeated for determining an aspheric curvature for each dioptric power from +7.00 to +16.00, and values therefor are set forth in the following X, Y coordinate table (marked Table I). In this table, $y$ equals distances outwardly along a flat plane 25 (see FIG. 1) through the vertex 28 of the aspheric curve and normal to the X—X axis of the lens (taken at 2 millimeter intervals) and $x$ equals departures (in millimeters) from this plane at such points. Also included in the table beneath each departure value are given instantaneous tangential and sagittal curvatures in dioptric power, suitably indicated by letters T and S for the respective points and these are plotted in FIGS. 2 and 3.

TABLE I

[Y=Distance from center of lens (in mm.)]

| Blank No. and Curve Description | 0 | 2 | 4 | 6 | 8 | 10 | 12 | 14 | 16 | 18 | 20 | 22 | 24 |
|---|---|---|---|---|---|---|---|---|---|---|---|---|---|
| #7.00 | | | | | | | | | | | | | |
| X | 0 | 0.0412 | 0.1648 | 0.3714 | 0.6618 | 1.0372 | 1.4993 | 2.0500 | 2.6922 | 3.4293 | 4.2653 | 5.2054 | 6.2556 |
| T | 10.91 | 10.90 | 10.88 | 10.85 | 10.80 | 10.76 | 10.71 | 10.66 | 10.61 | 10.57 | 10.52 | 10.47 | 10.41 |
| S | 10.91 | 10.90 | 10.90 | 10.89 | 10.87 | 10.85 | 10.83 | 10.81 | 10.79 | 10.77 | 10.84 | 10.72 | 10.70 |
| #8.00 | | | | | | | | | | | | | |
| X | 0 | 0.0448 | 0.1794 | 0.4045 | 0.7212 | 1.1310 | 1.6363 | 2.2398 | 2.9453 | 3.7572 | 4.6813 | 5.7243 | 6.8944 |
| T | 11.87 | 11.86 | 11.84 | 11.80 | 11.76 | 11.70 | 11.65 | 11.59 | 11.53 | 11.46 | 11.38 | 11.29 | 11.15 |
| S | 11.87 | 11.87 | 11.86 | 11.85 | 11.83 | 11.81 | 11.79 | 11.76 | 11.74 | 11.71 | 11.68 | 11.65 | 11.62 |
| #9.00 | | | | | | | | | | | | | |
| X | 0 | 0.0484 | 0.1937 | 0.4370 | 0.7797 | 1.2240 | 1.7729 | 2.4303 | 3.2013 | 4.0921 | 5.1103 | 6.2655 | 7.5688 |
| T | 12.81 | 12.80 | 12.78 | 12.75 | 12.71 | 12.67 | 12.61 | 12.56 | 12.49 | 12.41 | 12.30 | 12.14 | 11.92 |
| S | 12.81 | 12.81 | 12.80 | 12.79 | 12.78 | 12.78 | 12.74 | 12.72 | 12.69 | 12.67 | 12.64 | 12.60 | 12.55 |
| #10.00 | | | | | | | | | | | | | |
| X | 0 | 0.0519 | 0.2078 | 0.4688 | 0.8368 | 1.3146 | 1.9057 | 2.6152 | 3.4493 | 4.4159 | 5.5249 | 6.7882 | 8.2205 |
| T | 13.73 | 13.72 | 13.70 | 13.66 | 13.60 | 13.54 | 13.48 | 13.40 | 13.31 | 13.19 | 13.02 | 12.77 | 12.44 |
| S | 13.73 | 13.73 | 13.72 | 13.71 | 13.69 | 13.67 | 13.64 | 13.61 | 13.58 | 13.54 | 13.50 | 13.44 | 13.38 |
| #11.00 | | | | | | | | | | | | | |
| X | 0 | 0.0553 | 0.2215 | 0.4999 | 0.8928 | 1.4034 | 2.0363 | 2.7976 | 3.6948 | 4.7380 | 5.9394 | 7.3142 | 8.8811 |
| T | 14.64 | 14.62 | 14.59 | 14.54 | 14.47 | 14.39 | 14.30 | 14.20 | 14.08 | 13.90 | 13.66 | 13.31 | 12.83 |
| S | 14.64 | 14.63 | 14.62 | 14.60 | 14.58 | 14.55 | 14.51 | 14.48 | 14.44 | 14.39 | 14.33 | 14.25 | 14.15 |
| #12.00 | | | | | | | | | | | | | |
| X | 0 | 0.0586 | 0.2349 | 0.5303 | 0.9476 | 1.4905 | 2.1646 | 2.9770 | 3.9373 | 5.0574 | 6.3526 | 7.8418 | 9.5482 |
| T | 15.52 | 15.50 | 15.46 | 15.39 | 15.30 | 15.20 | 15.09 | 14.96 | 14.79 | 14.55 | 14.22 | 13.74 | 13.10 |
| S | 15.52 | 15.51 | 15.50 | 15.47 | 15.44 | 15.40 | 15.36 | 15.31 | 15.26 | 15.19 | 15.11 | 15.01 | 14.88 |
| #13.00 | | | | | | | | | | | | | |
| X | 0 | 0.0618 | 0.2479 | 0.5600 | 1.0010 | 1.5756 | 2.2902 | 3.1533 | 4.1762 | 5.3735 | 6.7635 | 8.3694 | 10.2196 |
| T | 16.37 | 16.35 | 16.30 | 16.21 | 16.10 | 15.98 | 15.83 | 15.66 | 15.44 | 15.13 | 14.68 | 14.05 | 13.22 |
| S | 16.37 | 16.37 | 16.35 | 16.32 | 16.28 | 16.23 | 16.18 | 16.12 | 16.05 | 15.96 | 15.86 | 15.72 | 15.55 |
| #14.00 | | | | | | | | | | | | | |
| X | 0 | 0.0650 | 0.2606 | 0.5888 | 1.0531 | 1.6587 | 2.4130 | 3.3260 | 4.4110 | 5.6853 | 7.1707 | 8.8952 | 10.8930 |
| T | 17.21 | 17.18 | 17.11 | 17.00 | 16.86 | 16.71 | 16.53 | 16.31 | 16.02 | 15.62 | 15.04 | 14.25 | 13.21 |
| S | 17.21 | 17.20 | 17.18 | 17.14 | 17.09 | 17.03 | 16.96 | 16.88 | 16.79 | 16.69 | 16.55 | 16.38 | 16.16 |
| #15.00 | | | | | | | | | | | | | |
| X | 0 | 0.0681 | 0.2730 | 0.6169 | 1.1039 | 1.7397 | 2.5328 | 3.4948 | 4.6412 | 5.9920 | 7.5732 | 9.4175 | 11.5660 |
| T | 18.02 | 17.99 | 17.90 | 17.76 | 17.59 | 17.39 | 17.17 | 16.90 | 16.52 | 16.03 | 15.31 | 14.33 | 13.08 |
| S | 18.02 | 18.01 | 17.98 | 17.93 | 17.87 | 17.79 | 17.71 | 17.61 | 17.50 | 17.37 | 17.20 | 16.99 | 16.72 |
| #16.00 | | | | | | | | | | | | | |
| X | 0 | 0.0710 | 0.2850 | 0.6442 | 1.1531 | 1.8183 | 2.6494 | 3.6594 | 4.8661 | 6.2928 | 7.9696 | 9.9348 | 12.2364 |
| T | 18.81 | 18.77 | 18.66 | 18.49 | 18.28 | 18.04 | 17.77 | 17.43 | 16.99 | 16.36 | 15.49 | 14.32 | 12.86 |
| S | 18.81 | 18.80 | 18.76 | 18.70 | 18.62 | 18.53 | 18.42 | 18.31 | 18.17 | 18.01 | 17.80 | 17.54 | 17.21 |

For blanks with intermediate dioptric powers, curves of adequate accuracy may be computed from the above tables by the simple process of interpolation.

As used above and hereinafter, the tangential curvature of each aspheric surface is (in known manner) that curvature at each point defined by X and Y in FIG. 1 and lying in the plane of the drawing, and numerically described by the X and Y coordinate values of Table I, and the sagittal curvatures are those curves created by rotating each of these surfaces described by the X and Y coordinates about the axis X—X. Also in known manner, the sagittal radius at any point X, Y is the length of a normal to the surface at this point from its intersection with axis X—X.

Figure 2:
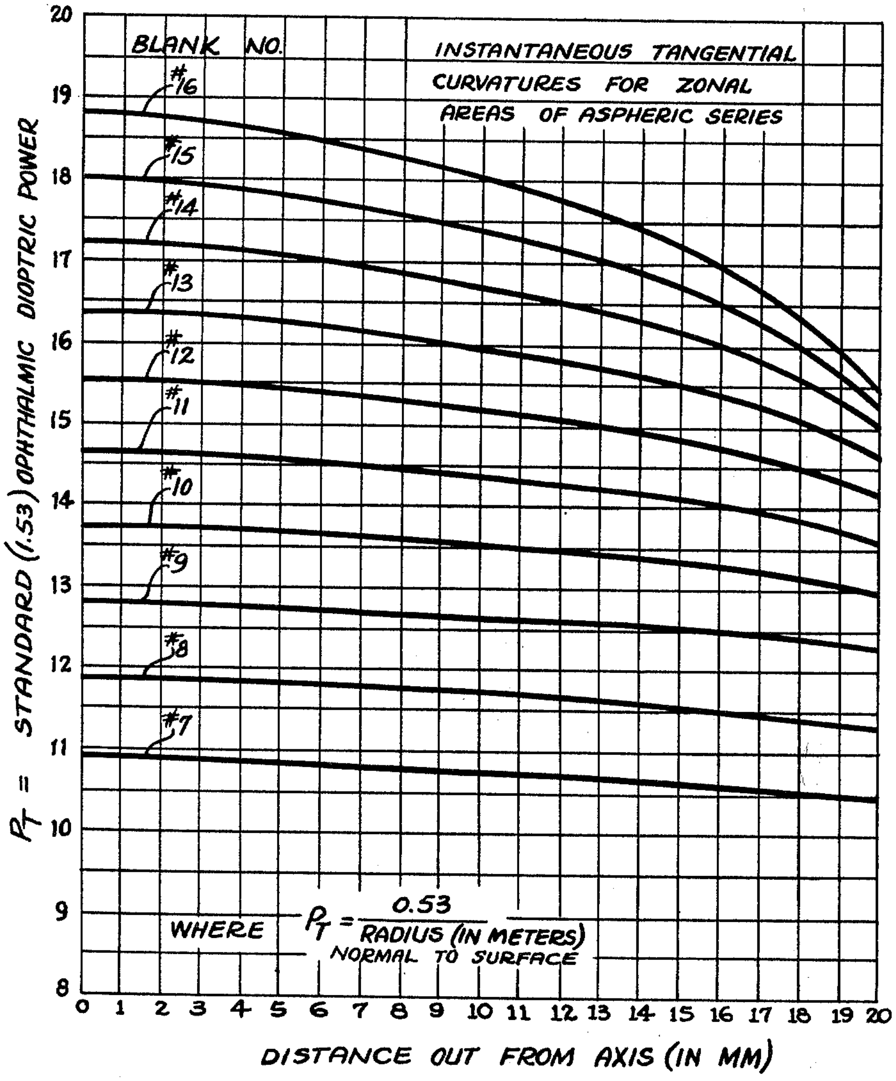
Figure 3:
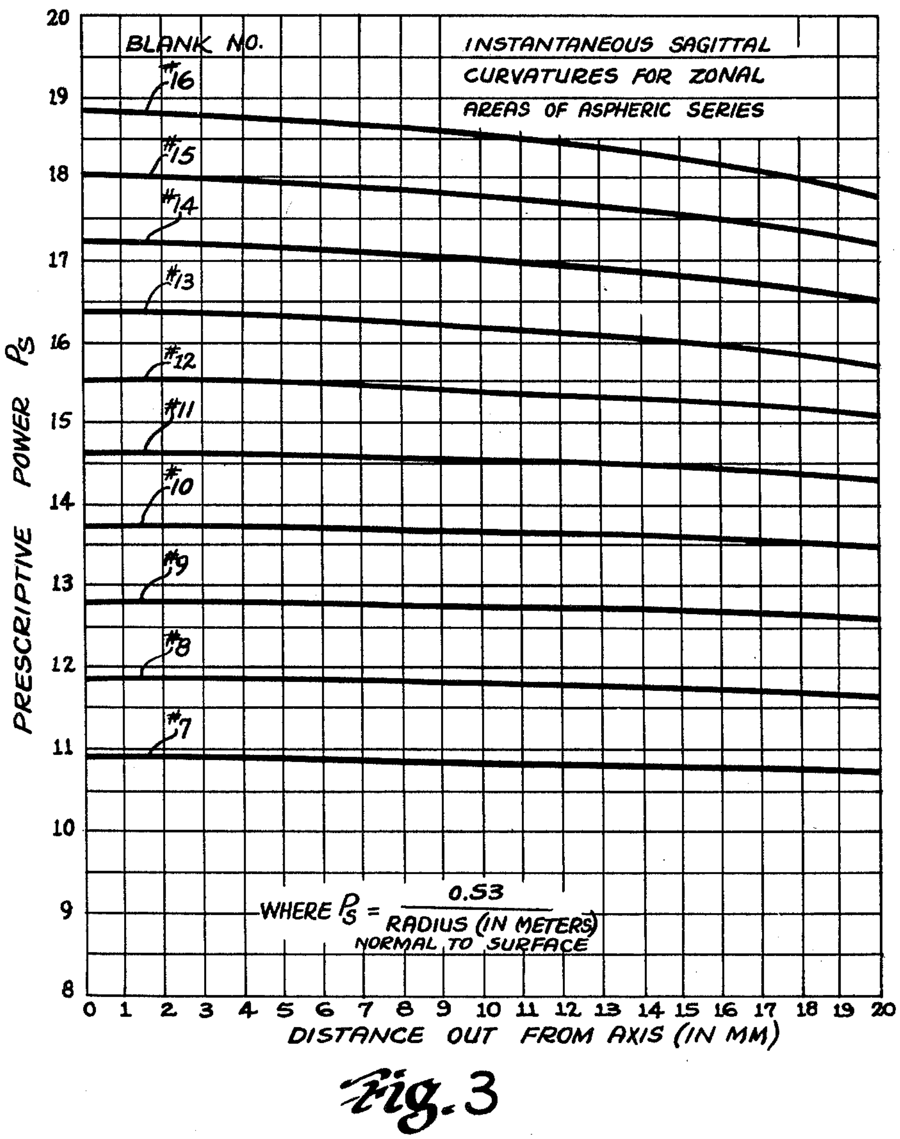

In FIG. 2 is indicated a graph of the instantaneous tangential curvatures plotted in millimeters against a standard (1.53) dioptric power scale for the ten aspheric curvatures of Table I. Likewise, in FIG. 3 is indicated a graph of the instantaneous sagittal curvatures plotted in millimeters against a standard (1.53) dioptric power scale for the ten aspheric curvatures of Table I.

Then in addition to the prescriptive power for which the blanks having the aspheric front curvatures are computed, other ocular base curves are applied to the rear of the same blanks with proper thicknesses to yield alternative prescriptions both slightly weaker and slightly stronger than that indicated by the nominal blank marking. These weaker and stronger prescriptions, when plotted as indicated relative to blanks #11.00, #11.50, #12.00, #12.50 and #13.00 in FIG. 4, yield a first group of steep diagonally extending lines indicative of tangential power errors and a second group of flatter diagonally extending lines indicative of sagittal power errors with slight departures in spherical curve values from the —3.50D base curve value initially used.

Since it is important, as stated previously, to keep the tangential error values at a minimum, and since it has been found that up to a point wherein the sagittal error values exceed 0.75D, it is desirable to have the tangential errors at a minimum but in order to keep sagittal errors within 0.75D tangential errors must be slightly positive, and since an uncorrected lens has a positive tangential error, it can be seen that such a limited series of only ten different blanks with aspherically curved fronts varying in half diopter steps, affording an excellent corrective lens series, can be obtained by not letting the tangential error vary more than 0.10 to 0.20 diopters. Of course, the sagittal errors will be somewhat greater but still within the allowable tolerance. Such small tangential errors, however, are useful since they afford some leaway as to errors resulting from manufacturing methods etc. and still provide a lens series which will perform well for the entire prescription series.

Figure 4:
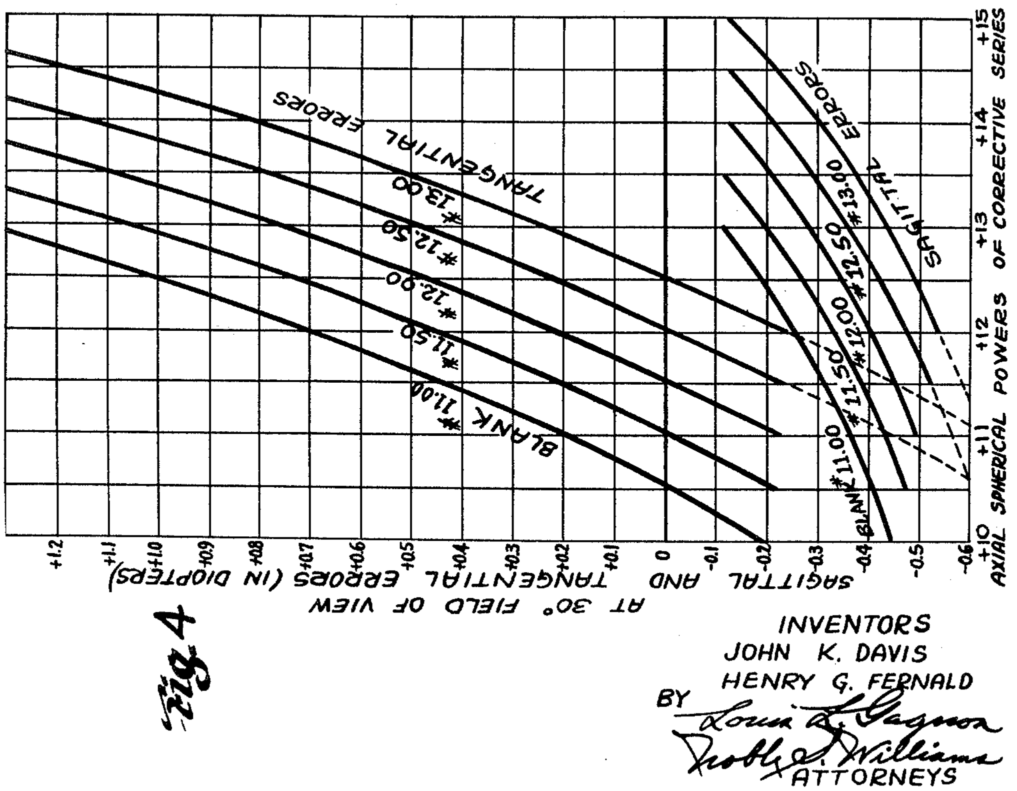
FIG. 4 is a graph showing curves for the tangential and sagittal errors for the 30° points in the field of view for several different aspherically curved surfaces combined with a preselected base curve of spherical power.

Having obtained the above-mentioned array of data indicating the performance of various combinations of front aspheric curvatures and spherical base curves for the ocular surface, it can be seen from FIG. 4 that blank #11 has approximately —0.20 diopters of tangential power error and —0.46 diopters of sagittal power error when a 10 diopter spherical prescription is obtained therefrom by combining this #11 blank with a —4.50 diopter spherical curve on the ocular side thereof rather than the previously mentioned —3.50D spherical curve thereon. Also, the tangential power errors for the #11 blank become increasingly positive with increase in dioptric power for the lenses produced therefrom until as the 12 diopter axial sphere power is approached, a +0.70 diopter tangential error is obtained. At this time, a —0.26D sagittal power error is obtained. Similarly, for each aspheric front curve with stronger axial sphere powers that that for which it was designed, the tangential error grows plus rapidly while the sagittal errors thereof grow positive at a slower rate but, nevertheless, remain negative in value.

It is desirable to have as few different aspheric front curves as is practical to obtain an optically correct lens series. However, a complete range should be cared for. This is possible in this design series. For example, starting at the portion of the graph of FIG. 4 indicating at +11.50 blank, and this blank is to be used for an 11.50 spherical correction, the tangential error is only +0.19 diopters and the sagittal error —0.38. However, if this same blank is to be used for a 10.50 diopter spherical correction, the tangential power error will become −0.22D and the sagittal error −0.48D. These error values are not extreme but definitely on the negative side of an optimum design. Therefore, it would be preferable if possible to not try to fabricate a 10.50D lens from a 11.50D blank. In fact, it would be a better policy to only use this 11.50D blank for prescription of 11.25D and 11.50D.

Nevertheless, this series design results in a practical number of aspheric blanks varying in half diopter steps and different combinations of only two different spherical base curves on the ocular side of the lens to care for the entire range of Rx prescriptions, yet it can be seen by the graph that the tangential power errors vary from prescription to prescription only by appoximately 0.10D. and the sagittal power error varies even less.

Slight departures from optimum designs are necessary in order to make use of conventional type ophthalmic lens tools for forming and measuring the final ocular surfaces of the lenses. Also since the larger number of aphakic prescriptions embody cylindrical corrections requiring different toric curvatures on the ocular side of the lens, a work chart A (see FIG. 5) gives values for sphere power, blank number, thickness, symbol (*a* or *b*) indicative of ocular curve and cylindrical power, and a supplement work chart B (see FIG. 6) defines symbols *a* and *b* in terms of radii for each sphere value (note $R_s$ in FIG. 1) and radii (note $R_c$ in FIG. 1) for each cylinder value of *a* and *b* power values for these radii.

Chart A is the guide to the step of selecting the proper aspheric blank number to be combined with the proper spherical or toric ocular curve for producing a desired finished prescription. It will be seen, for example, from the first column of blank numbers that a No. 14.00 blank may be used to yield not only a +14.00D spherical corrective lens but also used to yield a +13.75D spherical corrective lens by merely changing the spherical ocular curve to be used therewith from an *a* type to a *b* type; *a* being a −3.50D base curve and *b* being a −3.75D base curve. In addition to this, cylindrical values from 0.00 to −0.50D may also be produced from this same No. 14.00 blank by using as the ocular curve the appropriate cylinder value at the top of the first column of blank numbers and corresponding radii from chart B.

It can also be seen from the second column of blank numbers of chart A that this same No. 14.00 blank may be used over a range of cylinder values from −0.75 to −1.50D for a pair of prescriptions of +14.50D and +14.25 with proper *a* and *b* types of cylinders. Other combinations of spherical and cylindrical prescriptions for which the No. 14.00 blank is proper are similarly indicated in the third and fourth columns of blank numbers in chart A and proper radii in chart B. This extension of the use of a single aspheric blank over an appreciable range depending upon the cylinder to be combined with the spherical component of the prescription is in order to properly balance or average the tangential errors of the finished prescription at the two points of the toric as will be later described. For any cylinder value, there are two spherical prescriptions which may be obtained from a single blank depending on whether an *a* type curve or a *b* type curve is used.

Work charts A and B indicate, for example, that if a +14.00 sphere correction is to be used with a −2.00D cylindrical correction, the proper front aspheric is a No. 13.00 blank and the proper base curve to be used on the ocular side of the blank is an *a* type with a −2.00 toric curve. Chart B describes the toric tools and the exact radii, also the true power when used upon a plastic material having an index of 1.4925.

It is possible that some slight changes in the base curve on the ocular side of the lens might result in slight improvement in design over that obtained by the chart values. However, all toric prescriptions showing the blocks which are indicated by +13.00 blanks from sphere values +14.00 and +13.75 combined with cylinder values of −1.75 to −2.75 will have an average close to 0.25 diopters of tangential error at 30 degres and none will exceed the stated range of 0.00 to +0.50D.

Chart A, therefore, lists the sphere powers down the left-hand column and the cylinder powers to be formed across the top of the chart. In the body of the chart, nominal code numbers for the aspherically curved blanks are given. Thus, a +14.00 blank is the ideal blank to be used for a +14.00 spherical correction, and it is also the ideal blank to be used for certain toric prescriptions. The extreme left-hand column of chart A gives the prescribed center thickness *t* (see also FIG. 1) for these lenses which will yield an edge thickness *e*, from 2.2 to 2.3 mm. for a 40 mm. diameter lenticular spot. Also in FIG. 1, letters $R_F$ indicate the front radius of the lens outwardly of the lenticular spot and D is the distance between the rear vertex 27 and the pupil P.

A toric lens (see FIG. 8), of course, has two principal meridians, a base curve meridian 36 and a cylinder meridian 38, at right angles to each other and may even have one, the base curve meridian 36 which is also the cylinder axis, arranged at a given angle B relative to the horizontal. A point H 30 degrees out from the optical axis of the lens along this meridian 36 is called the No. 1 point of the toric lens. At this point H, the spherical or base curve provides the tangential focus of the lens and is called the tangential curvature, and the cylinder curve provides the sagittal focus of the lens and is called the sagittal curvature. Likewise, a point G 30 degrees out from the optical axis of the lens along the cylinder curve 38 is called the No. 2 point of the toric. This is the steepest curve on the ocular side of the lens and where the tangential curvature is the cylinder curvature and the saggittal curvature is the spherical curvature or base curve, of the ocular surface (slightly modified because of the very nature of manufacture of toric surfaces which gives on the base curve a slightly flatter condition at the No. 2 point than at the center of the lens).

Figure 7:
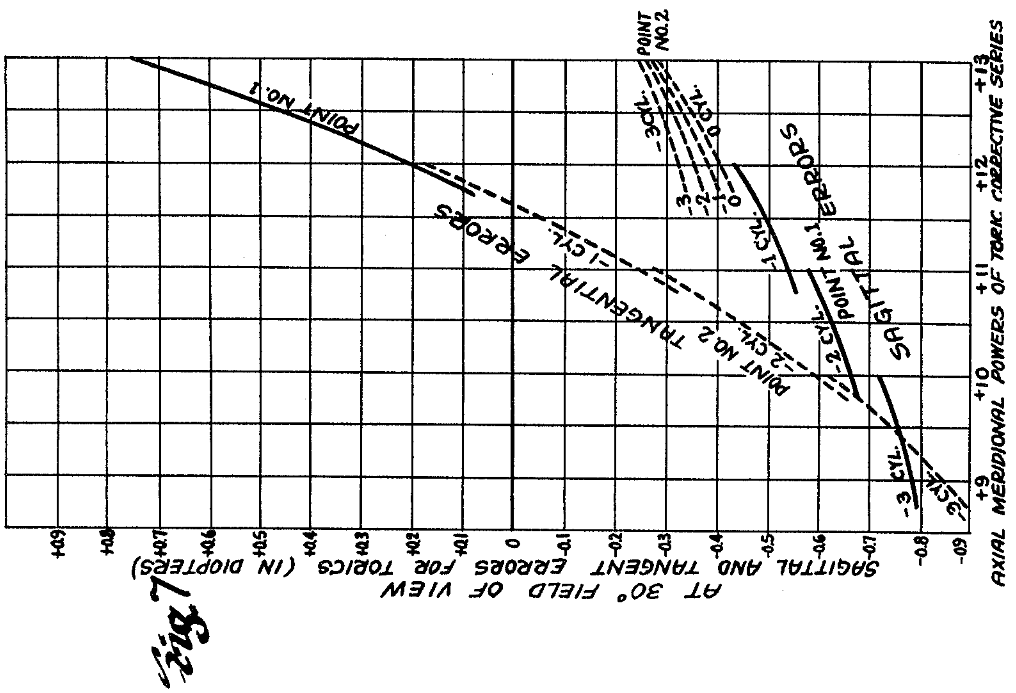
FIG. 7 is a chart in certain respects similar to that in FIG. 4 but for use in evaluating astigmatic aberrations of aspherically curved lenses provided with toric prescription corrections on the rear surface thereof.

FIG. 7 is a chart somewhat analogous to the chart of FIG. 4 but applies to toric prescriptions. This chart, instead of showing different aspherical lenses which might be obtained by varying the specific base curve, as in FIG. 4, indicates performance of a given aspheric blank with various combined sphere and cylinder curves to form a variety of toric lenses. A toric lens of such a character is shown at 26 in FIG. 8.

It will be noted that FIG. 7 shows by solid line in the upper part of the chart but one plot line for the tangential error at point No. 1. This plot line is directly comparable to the No. 12.00 plot line of FIG. 4, since the tangential performance of a toric lens in the spherical or base meridian thereof is equivalent to the performance of a lens of spherical prescription of like value. However, the sagittal focus at point No. 1 of the toric naturally depends on the curvature in the sagittal meridian. There are, therefore, a variety of sagittal error plots for point No. 1 depending on the cylindrical value of the prescription. As an example, three different solid line plots have been given for three cylinder values at the bottom of the chart.

Similarly, since the tangential focus at point No. 2 is dependent on the cylindrical curve employed, there results, therefore, a variety of tangential error plots for these No. 2 points also. Furthermore, although the sagital focus at point No. 2 depends on the sphere or base curve, because of the modification of the final curve on the ocular side of the lens as described above, the plots for this focus also vary slightly with cylinder values as will be noted from the group of dotted line sagittal error plots.

The graph of FIG. 7 illustrates how the tangential power goes negative at point 2 in the case of toric prescriptions, simply because a much stronger negative curve is placed on the ocular side of the lens in the cylinder meridian than in the sphere meridian. The reason, however, is a simple one to describe. An aspheric surface is a figure of revolution and its corrections are the same in all meridians of the lens. Its spherical correction on the ocular side is also a function of the base curve. In a toric prescription, on the other hand, there are in a sense two base curve values, one a relatively flat curve and one a stronger curve.

It is obvious then that an aspheric design for a base curve like the sphere meridian will not be optimum in the cylinder meridian. Nevertheless, it is desirable to reach an average value which will be reasonably well corrected at both points of the toric and better corrected at points in between. It is, therefore, logical that the tangential power errors in one meridian be averaged with the tangential power errors in the other, and that the positive errors be allowed to increase in one meridian in order to control the negative errors in the other.

Whereas FIG. 4 shows the performance of given aspheric blanks at a 30° field of view and when used for different spherical prescriptions, FIG. 7 shows for toric lenses formed from No. 12.00 blanks and at 30° fields of view their performances along given solid lines and given dotted lines depending on the indicated cylinder value of the toric, it also shows the difference between point No. 1 and point No. 2 of the toric, and it can be seen that for prescriptions for relatively strong cylinders, the No. 1 point of the toric tangential power errors are relatively positive and that at the No. 2 point of the same toric lens, the tangential power errors and the sagittal power errors are relatively strong negatively.

With a given prescription, the above condition can be deduced from the graph by referring to the effective power at the proper point of the toric. For example, if point No. 1 of the toric is plotted at 13 diopters and this plot is for a —3.00 cylinder correction, then at point No. 2, the errors for tangential errors of the toric lens will be read from the 10 diopter ordinate. If the plot is for 12 diopters at point No. 1, the tangential error for a —2.00 cylinder, again the value will be such as to be read from the 10 diopter ordinate for point No. 2. As discussed above, the sagittal focus at point No. 1 is formed by the cylinder curve and at point No. 2 by the base curve. Therefore, the sagittal errors in FIG. 7 for point No. 1 are read at the ordinate for the effective power for the cylinder meridian and the sagittal errors at point No. 2 are read at the effective power ordinate for the sphere meridian. For example, for a +12.00 sphere with a —2.00 cylinder the sagittal error at point No. 1 is plotted on the 10 diopter ordinate and the sagittal error for point No. 2 is plotted on the 12 diopter ordinate. It can be seen that at the point No. 2 of the toric with respect to the cylindrical prescription, the tangential point varies most and the sagittal power varies more at point No. 1 of the toric as between prescriptions but, as with the sphere values, even with the torics, the tangential power error changes are rapid, and is still the dominant error to be corrected.

It can further be seen from an examination of FIG. 7 that it is impossible to correct both points of the toric to a value of 0.2D, as was done with the spherical prescriptions. This is because there is but one aspheric curve to cure, in effect, two different conditions, one in the sphere meridian at point No. 1 and one in the cylinder meridian at point No. 2. It is possible, however, to average these two errors, and the errors intermediate these two points of the toric lens will be at a minimum. It is thus the design criterion of the toric series that this average be held close to +0.2 diopters in tangential power error.

Where compromises are necessary to extend the use which can be made of a given blank, this compromise will allow a variance generally in the positive direction in order to weight the improvement in the tangential power error at the cylinder meridian of the toric; that is, to keep the negative tangential power error down at the expense of increasing the positive tangential power error.

This is because by far the the greatest majority of cataract prescriptions are prescribed so that the No. 2 point of the toric on the cylinder meridian lies in or near the horizontal plane. Of course, as worn by the patient, it is more desirable to widen the horizontal field of the lens at the expense of the vertical field. The average power errors, however, are generally less than 0.2 diopters but always restricted to lie between 0.00 and +0.50 diopters.

Since various toric prescriptions made with one aspheric blank have been shown in FIG. 7 as related to a No. 12 blank and since this data is similar to the data shown for the same blank in FIG. 4, it can be seen that for practical purposes a toric prescription on a given blank may be considered, for convenience, as two different spherical prescriptions as shown in FIG. 4; and, therefore, FIG. 4 may be used as a guide for constructing the charts A and B of FIGS. 5 and 6, or other charts of a generally similar nature. Also, further study has shown that within the preferred tolerances mentioned above, adaptation of the spherical data to toric designs is practical within the dioptric range being considered therein.

It should be appreciated that the above series which give nominal power values for the aspheric front surfaces of lens blanks varying in half diopter steps teaches equally well how to design and make lenses within this series which are modified by interpolation so as to lie at points between the curve values already given.

There is another factor which enters into the problems of providing a cataract lens series of good performance and that is the sensitivity of the lenses to a change in eye position and the range which is available, such as may be involved in the fitting of the lenses and associated mount by the doctor to the face of the wearer while keeping the astigmatic errors within the above-mentioned tolerances. Sensitivity as to eye position, of course, is important since the patient seldom wears his lenses exactly at the position for which they were calculated.

It was believed that some designs of lenses might perform better over a suitable range of fitting distances than others, even though at their computed fitting distance of 23.25 mm. all might perform equally well. For this reason, tangential and sagittal errors were computed for a wide range of prescriptions using different base curves, and for each base curve, determining the proper aspheric front surface to be used to give the desired limited tangential power error. These designs were then evaluated using a 27 mm. eye distance and the changes in tangential and sagittal errors obtained compared with the 23.25 mm. values.

Figure 9:
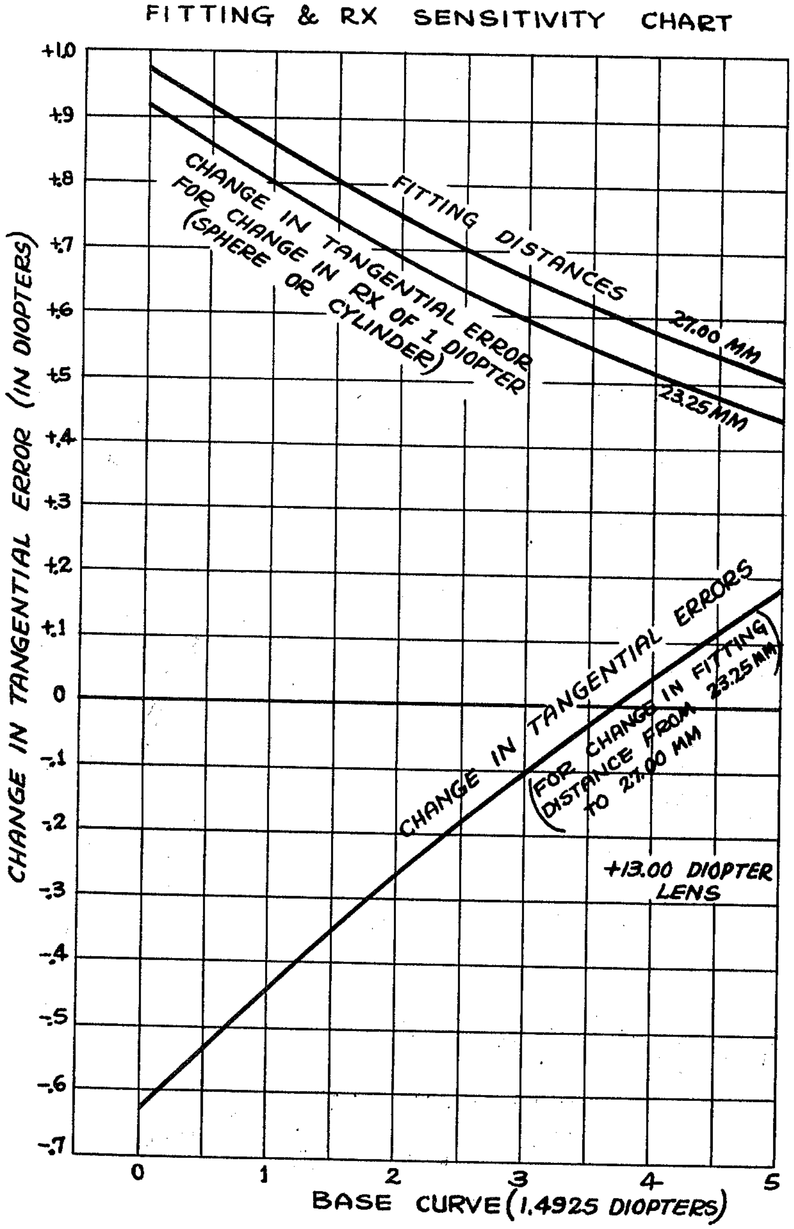
FIG. 9 is a chart for aid in designing lenses embodying the invention and in arriving at an optimum or preferred base curve for the series.

An example of the information so obtained is shown by the chart of FIG. 9 wherein changes in performance of +13.00 sphere at 27 mm. from the center of rotation are compared with its performance at 23.25 mm. from this center. The curve in the lower part of the chart shows how the sensitivity as to change in eye position varies with different base curves from a zero (flat) base curve. With a zero base curve, the tangential error change is approximately —0.64D when the lens is moved from its computed fitting distance of 23.25 mm. from the center of the eye to a second point 27 mm. from the eye. Similarly, when a lens designed with a —2.50D base curve is used at a 27.00 mm. eye distance instead of its computed fitting distance of 23.25 mm., there is a change in tangential error of approximately —0.18D. And when a lens designed with a —5.00D base curve is used at a 27.00 mm. distance instead of a 23.25 mm. distance, there is a change of approximately +0.19 diopter in tangential error. This, it will be noted, involves a change in sign. FIG. 9, therefore, shows that a sphere designed with approximately —3.50 to —3.75 diopters for the base curve will perform substantially in accordance with their design while affording a range of fitting distances from 23.25 mm. to 27.00 mm.

It is necessary that each computed aspheric surface curvature be usable over a narrow range of spherical prescription values, and, obviously, should perform well, and if it includes a cylinder correction, should perform well at both points on the resulting toric lens, the errors of which have been shown to be similar to those of two different spherical prescriptions. The lines near the top of FIG. 9 illustrate that for the two fitting positions (23.25 mm. and 27.00 mm.), the change in tangential power error obtained when the above-mentioned +13.00 diopter lens is modified by changing the ocular curve by one diopter, this change in prescription or cylinder curve changes the tangential error by only approximately 0.55 diopter per diopter of change while an equivalent one diopter change in a zero base curve lens would change the tangential power error thereof by approximately 0.9 diopter.

The information of FIGS. 5 and 6 combined with that contained in Table I gives the necessary data for fabricating an entire −2.00 to −4.00 base lens series which will perform with astigmatic aberrations of tangential errors at and within the 30 degree field of view limited, as described above, to fall within tolerances of 0.00 to +0.50 diopter; these tolerances being averages when referred to toric lenses. If it is desired to fabricate lenses of a slightly different base curve, FIG. 4 combined with Table I supplies the necessary information.

It can be seen, for example, from FIG. 4 that if it is desired to fabricate a +12.00 diopter lens with a −2.50D base curve (instead of the preferred −3.50D base curve) blank No. 11.00 may be used instead of the blank No. 12.00 and when No. 11.00 is combined with the −2.50 base ocular curve, it will yield a +12.00 diopter effective power and will simultaneously yield a tangential error at 30 degrees of approximately +0.70 diopter and a sagittal of approximately −0.26 diopter. However, if it is desired to provide this −2.50 base curve lens and at the same time have the tangential errors within the limits defined above, one needs to change the specifications for blank No. 11 in Table I in the tangential meridian by an amount equal to the improvement desired.

For example, if it is desired to have the tangential power error at approximately +0.20 diopter instead of +.70, one needs to lessen or flatten the tangential curve in Table I at the 30 degree point (at approximately 15 mm. from the center of the lens) by 0.50 diopter, and, of course, the points inwardly thereof proportionately less in a logical interpolative manner. Likewise, points outwardly of 15 mm. should be changed. Of course, the sagittal curvatures will also be changed, and these changes may be obtained by mathematically integrating the changes in the tangential curvatures, or by referring to the change in the sagittal power errors at the bottom of the chart in FIG. 4. Thus, the sagittal curve at 15 mm. will need to be flattened by the difference between −0.26D and the original design value of approximately −0.42D or, in other words, flattened by approximately 0.16 diopter. This procedure will provide on the new −2.50D base curve a lens well within our preferred astigmatic limits. Similarly, lenses with steeper base curves may also be derived from the chart of FIG. 4 and Table I.

It follows from the above consideration that satisfactory base curve values of as much as 1.5 diopters to either side of the preferred base curve values (indicated by FIGS. 5 and 6) may be obtained and with only slight losses for these later-mentioned series insofar as sensitivity to fitting distances and range of prescriptions (see FIG. 9) are concerned.

While we have mentioned above use of a transparent plastic of 1.4925 refractive index for the lenses of the improved series, it is believed obvious that plastics of different indices and glasses of various indices might be used instead, it being appreciated, of course, that various compensations would have to be made in certain of the above-disclosed values to adjust for this change in index.

In FIG. 10 is shown a lens from the improved aspheric lens series having formed upon a lower part of its aspheric front surface 40 a spherically shaped near the reading segment 42. Of course, such an added or integral segment need not alter the good acuity and wide field obtained through other parts of each lens of the above lens series.

Having described our invention, we claim:

1. A strongly convergent ophthalmic lens series for use by aphakic persons, and the like, and in which series each of the lenses thereof is of such similar optical design as to provide improved visual acuity at relatively wide fields of view including viewing angles of at least 30° relative to the optical axis of each respective lens and for all fitting distances of between approximately 23.25 mm. and 27 mm. from the ocular vertex thereof, and wherein blurring of images, particularly through marginal portions of the lenses, is materially reduced by reducing the tangential power errors of said lenses at said 30° locations substantially to a minimum, and preferably slightly positive in value, while the sagittal power errors at the same locations are maintained negative and allowed to increase in numerical values as long as they do not exceed acceptable limits, said lens series comprising a plurality of strongly convergent lenses of such controlled optical design as to provide a uniformly graduated group of aspheric lenses for supplying spherical prescriptions in a range of dioptric powers from +7.00D to +16.00D, as well as to provide a uniformly graduated group of toric lenses comprising the spherical prescriptions of said +7.00D to +16.00D range combined with cylindrical prescriptions in a range of dioptric powers from near zero to −4.00D, and with the prescriptions of each range being divided into equal steps of diopters and equal fractions thereof, all of the lenses of said series having aspherically curved surfaces on the front sides thereof, and said aspherically curved front surfaces comprising curvatures of different front vertex powers, said aspheric front surfaces of different vertex powers being computed in accordance with a predetermined single common selected negative spherical base curve value for the ocular sides of the lenses of said series, in accordance with the different predetermined axial thicknesses required for the lenses of different front curvatures and in accordance with the refractive index of the material of which the lenses are formed, so that said different front surface curvatures will have, in effect, at their respective optical axes front vertex power values which are so related to each other as to provide a predetermined substantially uniformly graduated series of power values each of which differs from the front vertex power values of adjacent lenses of said series by separate substantially equal steps, and with the value of each of said steps being selected from a range including fractions of a diopter up to but not exceeding one diopter, said single common negative spherical base curve value being selected from a dioptric range of from −2.00D to −5.00D, each of said lenses of different front vertex power values having its aspherically curved front surface so controlled in accordance with its front vertex power value, in accordance with the predetermined axial thickness required therefor, in accordance with said predetermined refractive index, and in accordance with said predetermined single common negative spherical base curve value, that when said different aspheric front surface curvatures are each actually combined, at the predetermined axial thicknesses required therefor, with spherical surfaces on the ocular sides thereof which are each of said single common negative spherical base curve value, a uniformly graduated group of finished lenses will be produced, with each lens thereof having at its optical axis substantially the true spherical prescriptive power value desired and at its 30° locations the minimum tangential power errors mentioned above, and when said different aspheric front surface curvatures are each actually combined with a single common negative spherical surface curvature of a given different negative spherical value on the ocular sides thereof, and which different spherical value is of a predetermined fraction of a diopter different in negative numerical value than that of said predetermined single common selected negative spherical base curve value, and at the different predetermined thicknesses required therefor, a second uniformly graduated group of finished lenses of intermediate prescriptive values will be provided, with each of the lenses thereof being of said predetermined fractional part of a diopter different in true spherical prescriptive power value at its optical axis than that of the corresponding finished lenses of said first-mentioned group, and will have at their 30° locations nearly the same minimum tangential power errors and sagittal power errors mentioned above, and with said minimum tangential power errors of the finished lenses of both of said groups of lenses being of numerical values near zero, while the sagittal power errors thereof at said 30° viewing angles are allowed to be of more negative values, but in no instance are said tangential power errors of any one of said finished lenses of either group allowed to be of a greater value than approximately +0.50D, and in no instance are the negative sagittal power errors of any one of said finished lenses allowed to exceed approximately −0.75D, and when said different aspheric front surface curvatures are provided with said spherical prescriptions on the ocular sides of the lenses combined with cylindrical prescriptions within said cylindrical range, and at the predetermined axial thicknesses required therefor, for providing toric lenses each having two different prescriptive curvatures along the cylindrical and spherical meridians thereof, the average of the tangential power errors at 30° points in the cylindrical meridian and in the spherical meridians of each resulting toric lens will be reduced to a minimum practical value while the average of the sagittal power errors at said 30° points in said meridians will be of materially more negative values, but in no instance will the average of the tangential power errors thereof be allowed to exceed approximately +0.50D and in no instance will the average of the sagittal power errors thereof be allowed to exceed approximately −0.75D.

2. A strongly convergent ophthalmic lens series for use by aphakic persons, and the like, and in which series each of the lenses thereof is of such similar optical design as to provide improved visual acuity at relatively wide fields of view including viewing angles of at least 30° relative to the optical axis of each respective lens and for all fitting distances of between approximately 23.25 mm. and 27 mm. from the ocular vertex thereof, and wherein blurring of images, particularly through marginal portions of the lenses, is materially reduced by reducing the tangential power errors of said lenses at said 30° locations substantially to a minimum, and preferably slightly positive in value, while the sagittal power errors at the same locations are maintained negative and allowed to increase in numerical values as long as they do not exceed acceptable limits, said lens series comprising a plurality of strongly convergent lenses of such controlled optical design as to provide a uniformly graduated group of aspheric lenses for supplying spherical prescriptions in a range of dioptric powers from +7.00D to +16.00D, as well as to provide a uniformly graduated group of toric lenses comprising the spherical prescriptions of said +7.00D to +16.00D range combined with cylindrical prescriptions in a range of dioptric powers from near zero to −4.00D, and with the prescriptions of each range being divided into equal steps of approximately one-quarter of a diopter, all of the lenses of said series having aspherically curved surfaces on the front sides thereof, and said aspherically curved front surfaces comprising curvatures of different front vertex powers, said aspheric front surfaces of different vertex powers being computed in accordance with a predetermined single common selected negative spherical base curve value for the ocular sides of the lenses of said series, in accordance with the different predetermined axial thicknesses required for the lenses of different front curvatures and in accordance with the refractive index of the material of which the lenses are formed, so that said different front surface curvatures will have, in effect, at their respective optical axes front vertex power values which are so related to each other as to provide a predetermined substantially uniformly graduated series of power values each of which differs from the front vertex power values of adjacent lenses of said series by separate substantially equal steps, and with the value of each of said steps being selected from a range including fractions of a diopter up to but not exceeding one-half diopter, said single common negative spherical base curve value being selected from a dioptric range of from −2.00D to −5.00D, each of said lenses of different front vertex power values having its aspherically curved front surface so controlled in accordance with its front vertex power value, in accordance with the predetermined axial thickness required therefor, in accordance with said predetermined refractive index, and in accordance with said predetermined single common negative spherical base curve value, that when said different aspheric front surface curvatures are each actually combined, at the predetermined axial thicknesses required therefor, with spherical surfaces on the ocular sides thereof which are each of said single common negative spherical base curve value, a uniformly graduated group of finished lenses will be produced, with each lens thereof having at its optical axis substantially the true spherical prescriptive power value desired and at its 30° locations the minimum tangential power errors mentioned above, and when said different aspheric front surface curvatures are each actually combined with a single common negative spherical surface curvature of a given different negative spherical value on the ocular sides thereof, and which different spherical value is of a quarter of a diopter different in negative numerical value than that of said predetermined single common selected negative spherical base curve value, and at the different predetermined thicknesses required therefor, a second uniformly graduated group of finished lenses of intermediate prescriptive values will be provided, with each of the lenses thereof being of a quarter of a diopter different in true spherical prescriptive value at its optical axis than that of the corresponding finished lenses of said first-mentioned group, and will have at their 30° locations nearly the same minimum tangential power errors and sagittal power errors mentioned above, and with said minimum tangential power errors of the finished lenses of both of said groups of lenses being of numerical values near zero, while the sagittal power errors thereof at said 30° viewing angles are allowed to be of more negative values, but in no instance are said tangential power errors of any one of said finished lenses of either group allowed to be of a greater value than approximately +0.50D, and in no instance are the negative sagittal power errors of any one of said finished lenses allowed to exceed approximately −0.75D, and when said different aspheric front surface curvatures are provided with said spherical prescriptions on the ocular sides of the lenses combined with cylindrical prescriptions within said cylindrical range, and at the predetermined axial thicknesses required therefor, for providing toric lenses each having two different prescriptive curvatures along the cylindrical and spherical meridians thereof, the average of the tangential power errors at 30° points in the cylindrical meridian and in the spherical meridians of each resulting toric lens will be reduced to a minimum practical value while the average of the sagittal power errors at said 30° points in said meridians will be of materially more negative values, but in no instance will the average of the tangential power errors thereof be allowed to exceed approximately +0.50D and in no instance will the average of the sagittal power errors thereof be allowed to exceed approximately −0.75D.

3. A series of semi-finished ophthalmic lens blanks for use in forming a series of strongly convergent lenses for aphakic persons, and the like, and which lenses when in finished form, will be of such similar optical design as to provide improved visual acuity at relatively wide fields of view including viewing angles of at least to 30° relative to the optical axis of each respective finished lens and for all fitting distances of between approximately 23.25 mm. and 27 mm. from the ocular vertex thereof, and wherein blurring of images, particularly through marginal portions of the finished lenses, is materially reduced by reducing the tangential power errors of said finished lenses substantially to a minimum, and preferably slightly positive in value, while the sagittal power errors at the same location are maintained negative and allowed to increase in numerical values as long as they do not exceed acceptable limits, said semi-finished lens blank series comprising a plurality of blanks which when formed into finished lenses are of such strong convergence and of such predetermined controlled optical design as to provide a uniformly graduated group of aspheric lenses for supplying spherical prescriptions in a range of dioptric powers from +7.00D to +16.00D, as well as to provide a uniformly graduated group of toric lenses comprising the spherical prescriptions of said +7.00D to +16.00D range combined with cylindrical prescriptions in a range of dioptric powers from near zero to −4.00D, and with the prescriptions of each range being divided into equal steps of diopters and equal fractions thereof, all of the blanks of said series of blanks having aspherically curved surfaces on the front side thereof, and said aspherically curved front surfaces of the different blanks of said series comprising curvatures of different front vertex powers, said aspheric front surfaces of different vertex powers being computed in accordance with a predetermined single common selected negative spherical base curve value for the ocular sides of said finished lenses, in accordance with the different predetermined axial thicknesses required for the finished lenses of different front curvatures, and in accordance with the predetermined refractive index of the material of which the blanks are formed, so that said different front surface curvatures will have, in effect, at their respective optical axes front vertex power values which are so related to each other as to provide a predetermined substantially uniformly graduated series of power values each of which differs from the front vertex power values of adjacent blanks of said series by separate substantially equal steps, and with the value of each of said steps being selected from a range including fractions of a diopter up to but not exceeding one diopter, said single common negative spherical base curve value being selected from a dioptric range of from −2.00D to −5.00D, each of the front surfaces of different front vertex power values having its aspheric curvature so controlled in accordance with its front vertex power value, in accordance with the predetermined axial thickness required therefor, in accordance with said predetermined refractive index, and in accordance with said predetermined single common negative spherical base curve value, that when said different aspheric front surface curvatures are each actually combined, at the predetermined axial thicknesses required therefor, with spherical surfaces on the ocular sides thereof which are each of said single common negative spherical base curve value, a uniformly graduated group of finished lenses will be produced with each lens thereof having at its optical axis substantially the true spherical prescriptive power value desired and at its 30° locations the minimum tangential power errors mentioned above, and when said different aspheric front surface curvatures are each actually combined with a single common negative spherical surface curvature of a given different negative spherical value on the ocular sides thereof, and which different spherical value is of a predetermined fraction of a diopter different in negative numerical value than that of said predetermined single common selected negative spherical base curve value, and at the different predetermined thicknesses required therefor, a second uniformly graduated group of finished lenses of intermediate prescriptive values will be provided, with each of the lenses thereof being of said predetermined fractional part of a diopter different in true spherical prescriptive power value at its optical axis than that of the corresponding finished lenses of said first-mentioned group, and will have at their 30° locations nearly the same minimum tangential power errors mentioned above, and with said minimum tangential power errors of the finished lenses of both of said groups of lenses being of numerical values near zero, while the sagittal power errors thereof at said 30° viewing angles are allowed to be of more negative values, but in no instance are said tangential power errors of any one of said finished lenses of either group allowed to be of a greater value than approximately +0.50D, and in no instance are the negative saggital power errors of any one of said finished lenses allowed to exceed approximately −0.75D, and when said different aspheric front surface curvatures are provided with said spherical prescriptions on the ocular sides of the blanks combined with cylindrical prescriptions within said cylindrical range, and at the predetermined axial thicknesses required therefor, for providing toric lenses each having two different prescriptive curvatures along the cylindrical and spherical meridians thereof, the average of the tangential power errors at 30° points in the cylindrical meridian and in the spherical meridians of each resulting toric lens will be reduced to a minimum practical value while the average of the sagittal power errors at said 30° points in said meridians will be of materially more negative values, but in no instance will the average of the tangential power errors thereof be allowed to exceed approximately +0.50D and in no instance will the average of the sagittal power errors thereof be allowed to exceed approximately −0.75D.

4. A strongly convergent ophthalmic lens series for use by aphakic persons, and the like, and in which series each of the lenses thereof is of such similar optical design as to provide improved visual acuity at relatively wide fields of view including viewing angles of at least 30° relative to the optical axis of each respective lens and for all fitting distances of between approximately 23.25 mm. and 27 mm. from the ocular vertex thereof, and wherein blurring of images, particularly through marginal portions of the lenses, is materially reduced by reducing the tangential power errors of said lenses at said 30° locations substantially to a minimum, and preferably slightly positive in value, while the sagittal power errors at the same locations are maintained negative and allowed to increase in numerical values as long as they do not exceed acceptable limits, said lens series comprising a plurality of strongly convergent lenses of such controlled optical design as to provide a uniformly graduated group of aspheric lenses for supplying spherical prescriptions in a range of dioptric powers from +7.00D to +16.00D, as well as to provide a uniformly graduated group of toric lenses comprising the spherical prescriptions of said +7.00D to +16.00D range combined with cylindrical prescriptions in a range of dioptric powers from near zero to −4.00D, and with the prescriptions of each range being divided into equal steps of diopters and equal fractions thereof, all of the lenses of said series having aspherically curved surfaces on the front sides thereof, and said aspherically curved front surfaces comprising curvatures of different front vertex powers, said aspheric front surfaces of different vertex powers being computed in accordance with a predetermined single common selected negative spherical base curve value for the ocular sides of the lenses of said series, in accordance with the different predetermined axial thicknesses required for the lenses of different front curvatures and in accordance with the refractive index of the material of which the lenses are formed, so that said different front surface curvatures will have, in effect, at their respective optical axes front vertex power values which are so related to each other as to provide a predetermined substantially uniformly graduated series of power values each of which differs from the front vertex power values of adjacent lenses of said series by separate substantially equal steps, and with the value of each of said steps being selected from a range including fractions of a diopter up to but not exceeding one diopter, said single common negative spherical base curve value being selected from a dioptric range of from −2.00D to −5.00D, each of said lenses of different front vertex power values having its aspherically curved front surface so controlled in accordance with its front vertex power value in accordance with the predetermined axial thickness required therefor, in accordance with said predetermined refractive index, and in accordance with said predetermined single common negative spherical base curve value, that when said different aspheric front surface curvatures are each actually combined, at the predetermined axial thicknesses required therefor, with spherical surfaces on the ocular sides thereof which are each of said single common negative spherical base curve value, a uniformly graduated group of finished lenses will be produced, with each lens thereof having at its optical axis substantially the true spherical prescriptive power value desired and at its 30° locations the minimum tangential power errors mentioned above, and when said single common negative spherical base curve value is approximately −3.50D the instantaneous tangential (T) and sagittal (S) curvatures at the front vertex and at selected distances outwardly therefrom for each of said different aspheric front surface curvatures will be approximately equal to the dioptric power values indicated in the following table:

| Prescriptive Dioptric Power | Instantaneous Tangential and Sagittal Curvatures (in Standard 1.53 Diopters) at Distances From lens Axis in mm. | | | | | |
|---|---|---|---|---|---|---|
| | | 0 | 4 | 8 | 12 | 16 |
| # +7.00 | T | 10.91 | 10.88 | 10.80 | 10.71 | 10.61 |
| | S | 10.91 | 10.90 | 10.87 | 10.83 | 10.79 |
| # +8.00 | T | 11.87 | 11.84 | 11.76 | 11.65 | 11.53 |
| | S | 11.87 | 11.86 | 11.83 | 11.79 | 11.74 |
| # +9.00 | T | 12.81 | 12.78 | 12.71 | 12.61 | 12.49 |
| | S | 12.81 | 12.80 | 12.78 | 12.74 | 12.69 |
| # +10.00 | T | 13.73 | 13.70 | 13.60 | 13.48 | 13.31 |
| | S | 13.73 | 13.72 | 13.69 | 13.64 | 13.58 |
| # +11.00 | T | 14.64 | 14.59 | 14.47 | 14.30 | 14.08 |
| | S | 14.64 | 14.62 | 14.58 | 14.51 | 14.44 |
| # +12.00 | T | 15.52 | 15.46 | 15.30 | 15.09 | 14.79 |
| | S | 15.52 | 15.50 | 15.44 | 15.36 | 15.26 |
| # +13.00 | T | 16.72 | 16.30 | 16.10 | 15.83 | 15.44 |
| | S | 16.72 | 16.35 | 16.28 | 16.18 | 16.05 |
| # +14.00 | T | 17.21 | 17.11 | 16.86 | 16.53 | 16.02 |
| | S | 17.21 | 17.18 | 17.09 | 16.96 | 16.79 |
| # +15.00 | T | 18.02 | 17.90 | 17.59 | 17.17 | 16.52 |
| | S | 18.02 | 17.98 | 17.87 | 17.71 | 17.50 |
| # +16.00 | T | 18.81 | 18.66 | 18.28 | 17.77 | 16.99 |
| | S | 18.81 | 18.76 | 18.62 | 18.42 | 18.17 |

and when said different aspheric front surface curvatures are each actually combined with a single common negative spherical surface curvature of a given different negative spherical value on the ocular sides thereof, and which different spherical value is of a predetermined fraction of a diopter different in negative numerical value than that of said predetermined single common selected negative spherical base curve value, and at the different predetermined thicknesses required therefor, a second uniformly graduated group of finished lenses of intermediate prescriptive values will be provided, with each of the lenses thereof being of said predetermined fractional part of a diopter different in true spherical prescriptive power value at its optical axis than that of the corresponding finished lenses of said first-mentioned group, and will have at their 30° locations nearly the same minimum tangential power errors and sagittal power errors mentioned above, and with said minimum tangential power errors of the finished lenses of both of said groups of lenses being of numerical values near zero, while the sagittal power errors thereof at said 30° viewing angles are allowed to be of more negative values, but in no instance are said tangential power errors of any one of said finished lenses of either group allowed to be of a greater value than approximately +0.50D, and in no instance are the negative sagittal power errors of any one of said finished lenses allowed to exceed approximately −0.75D, and when said different aspheric front surface curvatures are provided with said spherical prescriptions on the ocular sides of the lenses combined with cylindrical prescriptions within said cylindrical range, and at the predetermined axial thicknesses required therefor, for providing toric lenses having two different prescriptive curvatures along the cylindrical and spherical meridians thereof, the average of the tangential power errors at 30° points in the cylindrical meridian and in the spherical meridians of each resulting toric lens will be reduced to a minimum practical value while the average of the sagittal power errors at said 30° points in said meridians will be of materially more negative values, but in no instance will the average of the tangential power errors thereof be allowed to exceed approximately +0.50D and in no instance will the average of the sagittal power errors thereof be allowed to exceed approximately −0.75D.

5. A strongly convergent ophthalmic lens for use by an aphakic person or the like and providing a predetermined prescription having a spherical dioptric power value lying within a range of from approximately +7.00 to +16.00 diopters and a cylindrical dioptric power value lying within a range of from 0 to approximately −4.00 diopters, said lens being formed of a transparent material of a predetermined refractive index and having an aspherically curved front surface and a prescription-containing rear surface disposed upon opposite sides of said lens in such spaced relation to each other as to provide a predetermined axial thickness for said lens, the curvature of said rear surface having along a base curve meridian thereof a predetermined spherical ocular base curve value which lies within a range of from approximately −2.00 to −5.00 diopters, said aspherically curved front surface having a front vertex power value which is substantially equal to the difference between said predetermined spherical prescriptive power value and said predetermined ocular base curve value, and said aspherically curved front surface curvature being of such a value as to have a continuously lessening curvature when considered therealong from said front vertex outwardly to the outer marginal portions of said lens, and which aspheric curvature is such as to provide, at viewing locations at 30° from the axis of said lens and through the high points on the cylinder meridian of the lens and through the low points on the base curve meridian at right angles thereto, and for a fitting distance from the center of rotation of the eye to the ocular vertex of the lens lying between approximately 23.25 and 27.00 millimeters, an average tangential power error between the high and low point values which is reduced to a practical minimum value and which lies between approximately 0 to +.50 diopters, while the average of the sagittal power error values of said lens for the same 30° viewing locations is allowed to be materially more negative than said minimum average tangential power error, and which average sagittal power error value lies between approximately 0 and −0.75 diopters, whereby a wider corrected field of viewing affording improved visual acuity in the horizontal and most commonly used direction of the lens will be provided.

References Cited by the Examiner

UNITED STATES PATENTS

| | | | |
|---|---|---|---|
| 949,501 | 2/10 | Von Rohr | 88—57 |
| 1,588,559 | 6/26 | Tillyer | 88—54 |
| 2,391,045 | 12/45 | Tillyer | 88—54 |

JEWELL H. PEDERSEN, *Primary Examiner.*

EMIL ANDERSON, FREDERICK M. STRADER, *Examiners.*